United States Patent [19]
Phelan

[11] Patent Number: 5,525,919
[45] Date of Patent: * Jun. 11, 1996

[54] SENSE AMPLIFIER WITH LIMITED OUTPUT VOLTAGE SWING

[75] Inventor: Cathal G. Phelan, Santa Clara, Calif.

[73] Assignee: Cypress Semiconductor Corporation, San Jose, Calif.

[ * ] Notice: The term of this patent shall not extend beyond the expiration date of Pat. No. 5,347,183.

[21] Appl. No.: 245,621

[22] Filed: May 18, 1994

Related U.S. Application Data

[63] Continuation of Ser. No. 956,794, Oct. 5, 1992, Pat. No. 5,347,183.

[51] Int. Cl.⁶ .................................................. G01R 19/00
[52] U.S. Cl. .............................................. 327/52; 327/309
[58] Field of Search ........................... 307/530; 365/207, 365/208; 327/309, 321, 322, 318, 51–57

[56] References Cited

U.S. PATENT DOCUMENTS

| | | | |
|---|---|---|---|
| 4,785,427 | 11/1988 | Young | 365/207 |
| 4,991,141 | 2/1991 | Tran | 365/207 |
| 5,023,841 | 6/1991 | Akrout et al. | 365/207 |
| 5,065,055 | 11/1991 | Reed | 307/530 |
| 5,068,831 | 11/1991 | Hoshi et al. | 307/530 |
| 5,088,065 | 2/1992 | Hanamura et al. | 365/208 |
| 5,132,574 | 7/1992 | Yumoto | 307/530 |
| 5,155,397 | 10/1992 | Fassino et al. | 307/530 |
| 5,160,861 | 11/1992 | Lee | 307/530 |
| 5,272,395 | 12/1993 | Vincelette | 307/530 |
| 5,274,275 | 12/1993 | Colles | 307/530 |
| 5,276,369 | 1/1994 | Hayakawa et al. | 307/530 |

*Primary Examiner*—Toan Tran
*Attorney, Agent, or Firm*—Blakely, Sokoloff, Taylor & Zafman

[57] ABSTRACT

A sense amplifier circuit having a pair of complementary inputs and a pair of complementary outputs with voltage swing limiter and cross-coupled feedback to tail devices. The sense amplifier circuit comprises first differential amplifier for receiving the pair of complementary inputs to generate first output of the pair of complementary outputs. The first differential amplifier is coupled to a first current source device for biasing. The circuit also comprises second differential amplifier for receiving the pair of complementary inputs to generate second output of the pair of complementary outputs. The second differential amplifier is coupled to a second current source device for biasing. A voltage swing limiter is coupled to the pair of complementary outputs of the first and second differential amplifiers for limiting the voltage swing of the pair of complementary outputs. A feedback circuit is coupled to feed the outputs back to drive the other tail device.

1 Claim, 10 Drawing Sheets

SENSE AMPLIFIER WITH LIMITED OUTPUT VOLTAGE SWING

This is a continuation of application Ser. No. 07/956,794, filed Oct. 5, 1992, now U.S. Pat. No. 5,347,183.

BACKGROUND OF THE INVENTION

1. Field of the Invention

The present invention relates to random-access memory data paths and more specifically to the sense amplifiers for the static random-access memory data paths.

2. Art Background

Figure 1:
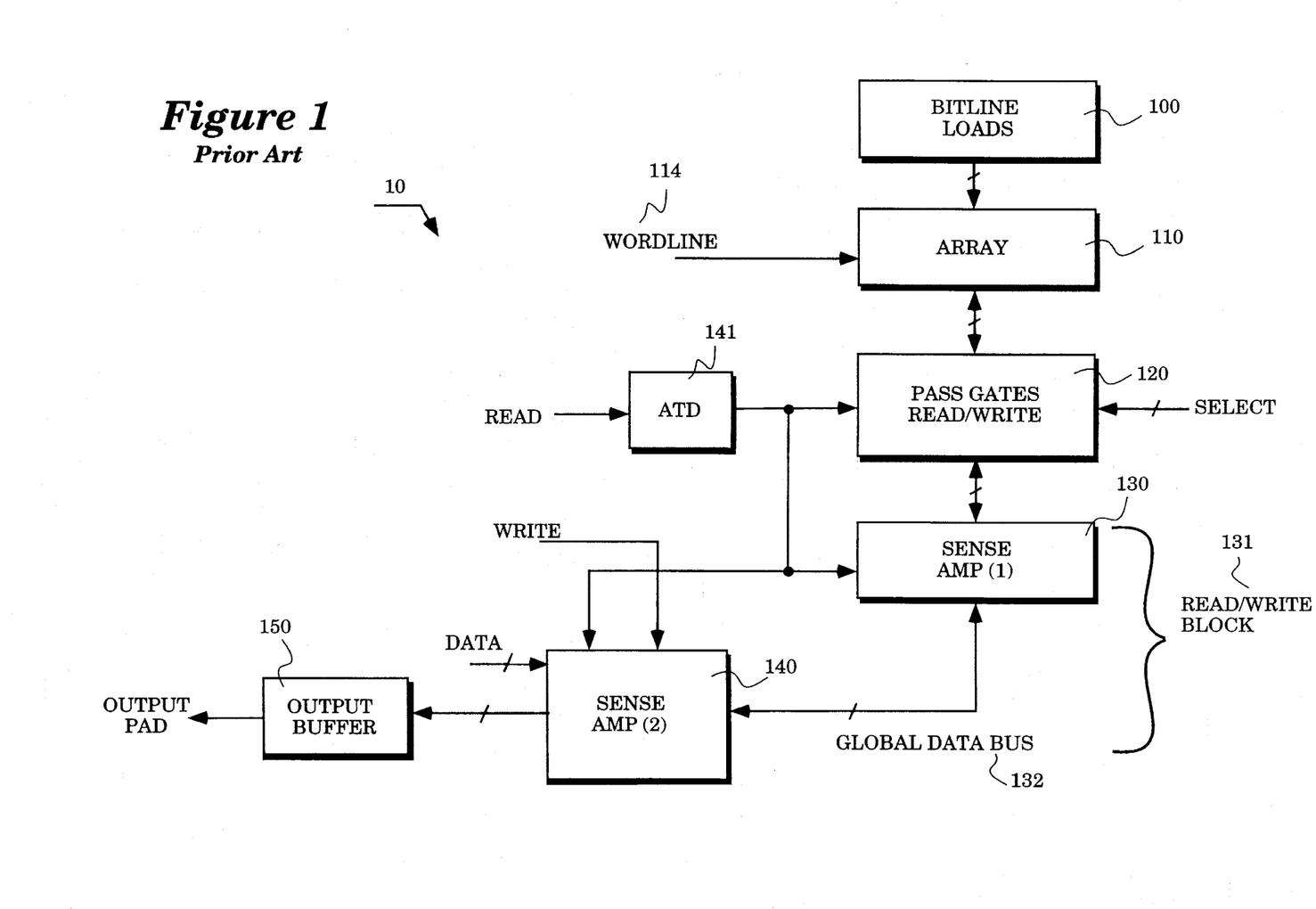
FIG. 1 illustrates a data path used in the static random-access memory (SRAM) architectural scheme.

A data path, such as the one shown in FIG. 1, in the static random-access memory (SRAM) architectural scheme has been well known in industry. Referring to FIG. 1, a symbolic representation of data path 10 for a typical SRAM is illustrated. Bit-line loads 100 are typically implemented in p-channel devices permanently enabled as will be appreciated by those skilled in the art. Coupled to bit-line loads 100 is data array 110. Charges stored in data array 110 are passed to pass gates 120, typically implemented in n-channel devices for the write path and p-channel devices for the read path. Although not illustrated in FIG. 1, separate buses are implemented for both the write and read paths. Following pass gates 120 is the beginning of the sensing section of data-path 10. Read/Write block 131 contains first sense amplifier 130, global data bus 132, second sense amplifier 140 and output buffer 150. An address transition detection circuit (ATD) 141 is used in data path 10 to produce appropriate pulses when word-line 114 switches, thus acting as a pseudo-clock signal. The ATD pulse, which is widely used in the SRAM industry, serves to equalize or reset voltage nodes between each access cycle. This kind of equalizing technique has been in use on nearly all fast SRAMs since 1984. However, as better and better performance is expected with each new generation of products, the circuitry required to generate the ATD pulse becomes more and more cumbersome and is in some cases the critical path for performance itself. It will be appreciated by those skilled in the art the disadvantages of the ATD system typically stem from large current spikes (when equalizing/resetting) and both process and floor-plan skewing of the ATD pulse. If the ATD pulse arrives too late or too early, too long or too short, it can destroy data or cause access delay.

Therefore, it is desirable to eliminate the need to equalize voltage levels between cycles and to detect the beginning of a new cycle. It is also desirable to reduce the circuitry required by an SRAM and to increase its performance, while shortening its design cycle.

As will be described in the following, the present invention achieves the objects by the use of two techniques. First, the voltage swing allowed on the output of the sense amplifier is reduced such that the recovery time between accesses is reduced. Second, the output voltages of the sense amplifiers are used in a cross-coupled formation to drive the tail devices to enhance the rate of change of the circuit.

SUMMARY OF THE INVENTION

A sense amplifier circuit having a pair of complementary inputs and a pair of complementary outputs with voltage swing limiter and cross-coupled feedback to tail devices is disclosed. The sense amplifier circuit comprises first differential amplifier for receiving the pair of complementary inputs to generate first output of the pair of complementary outputs. The first differential amplifier is coupled to a first current source device for biasing. The circuit also comprises second differential amplifier for receiving the pair of complementary inputs to generate second output of the pair of complementary outputs. The second differential amplifier is coupled to a second current source device for biasing. A voltage swing limiter is coupled to the pair of complementary outputs of the first and second differential amplifiers for limiting the voltage swing of the pair of complementary outputs. A feedback circuit is coupled to feed the outputs back to drive the other tail device.

BRIEF DESCRIPTION OF THE DRAWINGS

The objects, features and advantages of the present invention will become apparent to one skilled in the art from reading the following detailed description in which.

DETAILED DESCRIPTION OF THE INVENTION

A sense amplifier with limited output swing and positive cross-feedback in the tail device of the differential amplifier is disclosed. In the following description, numerous specific details, such as n-channel or p-channel transistors, are set forth in order to provide a thorough understanding of the present invention. It will be obvious, however, to one skilled in the art that these details are not required to practice the present invention. In other instances, well known circuits, methods and the like, are not set forth in detail in order to avoid unnecessarily obscuring the present invention.

Figure 2:
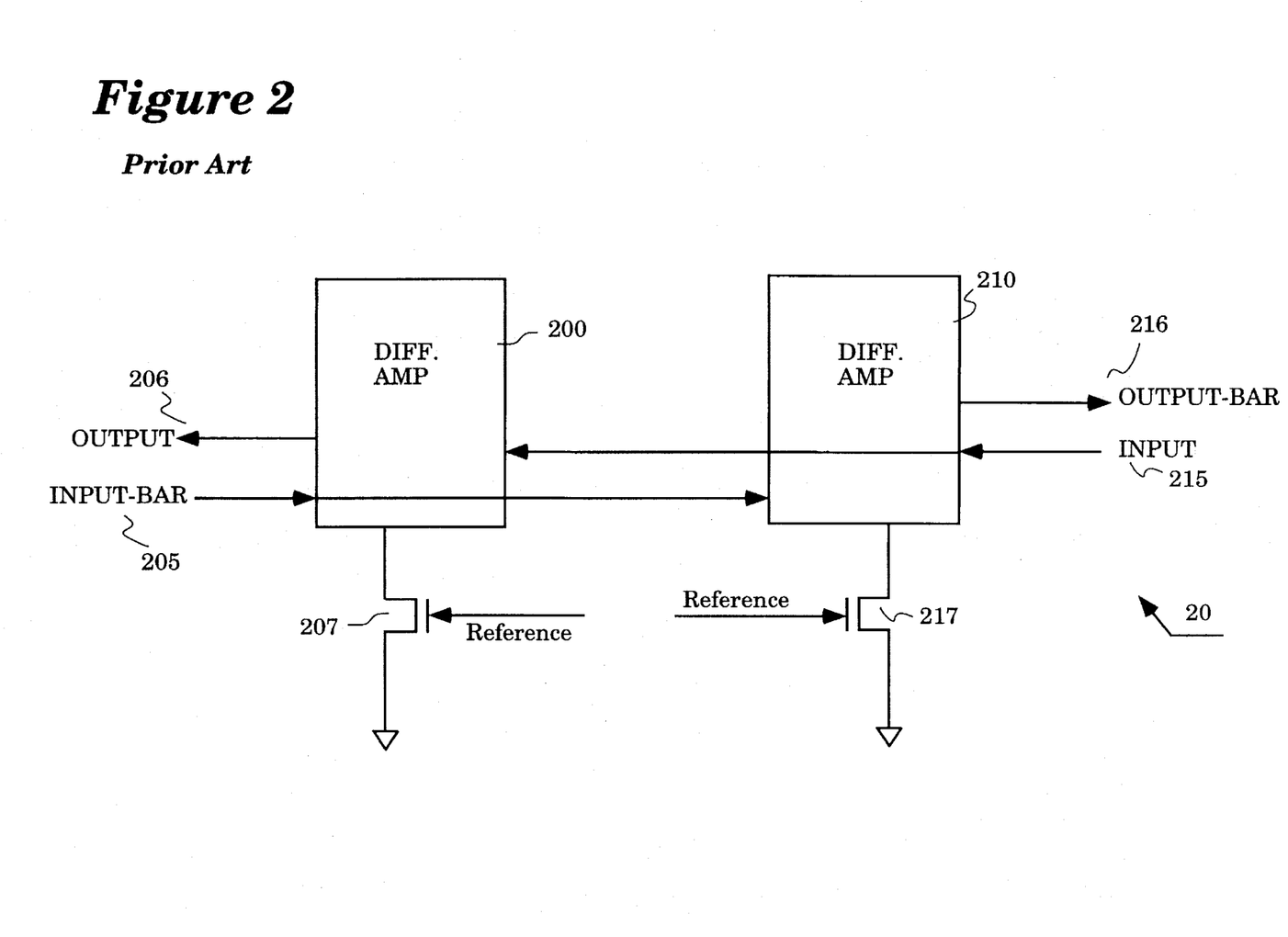
FIG. 2 is a simplified representation of two dual-input, signal-output differential amplifiers commonly used in the prior art sense amplifier.

FIG. 2 is a simplified representation of two dual-input, single-output differential amplifiers commonly used in the prior art data path 10 sense amplifier 20. As shown in FIG. 2, differential amplifier 200 with dual inputs 205, 215 and single output 206 is controlled by a current limiting tail transistor 207. Typically, the tail voltage is either self-biased or externally driven. Similarly, differential amplifier 210, which receives dual inputs 205, 215 to generate output-bar 216, is also controlled by tail transistor 217.

Figure 3:
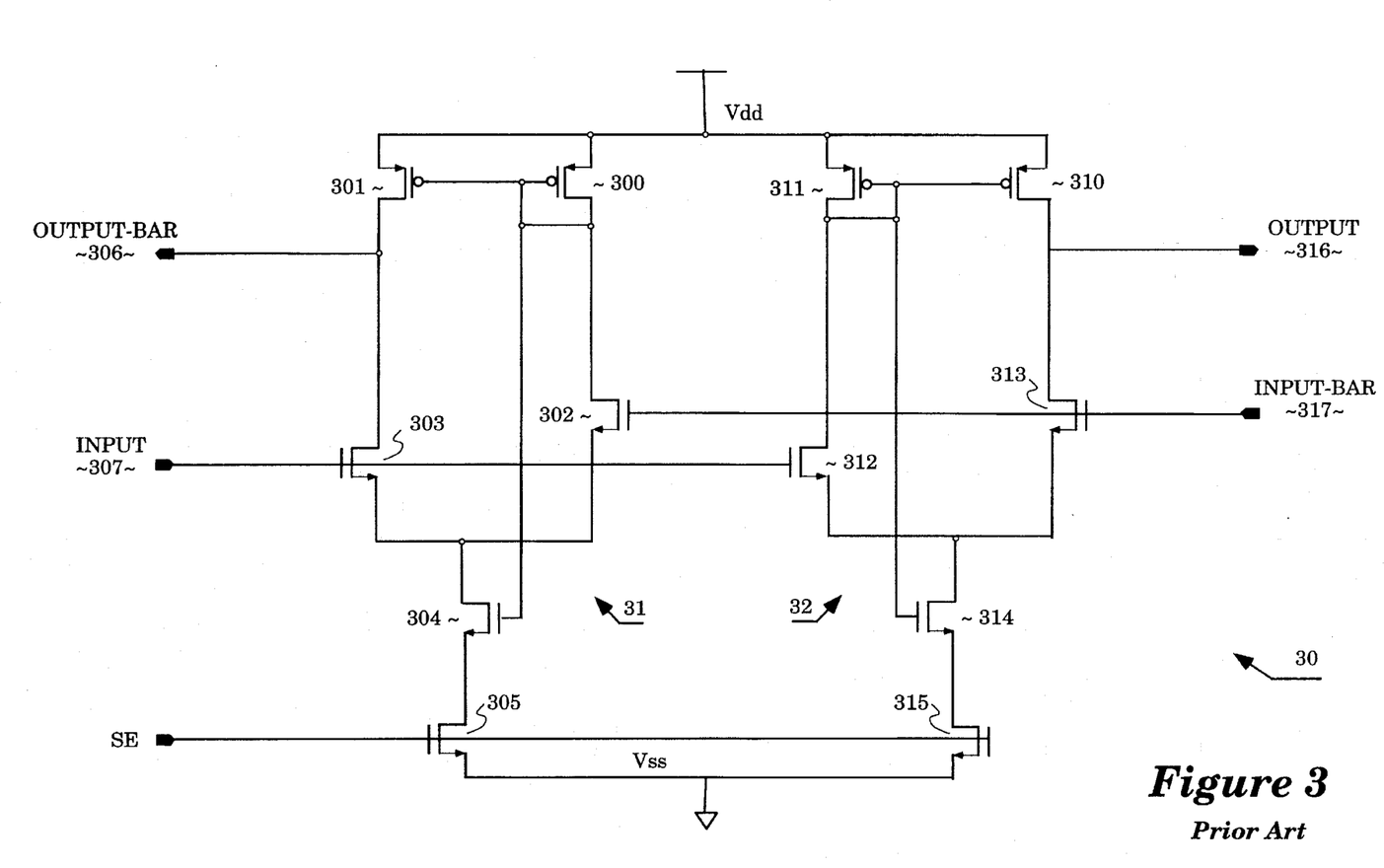
FIGS. 3 is the schematic diagram of prior art sense amplifier.
Figure 3A:
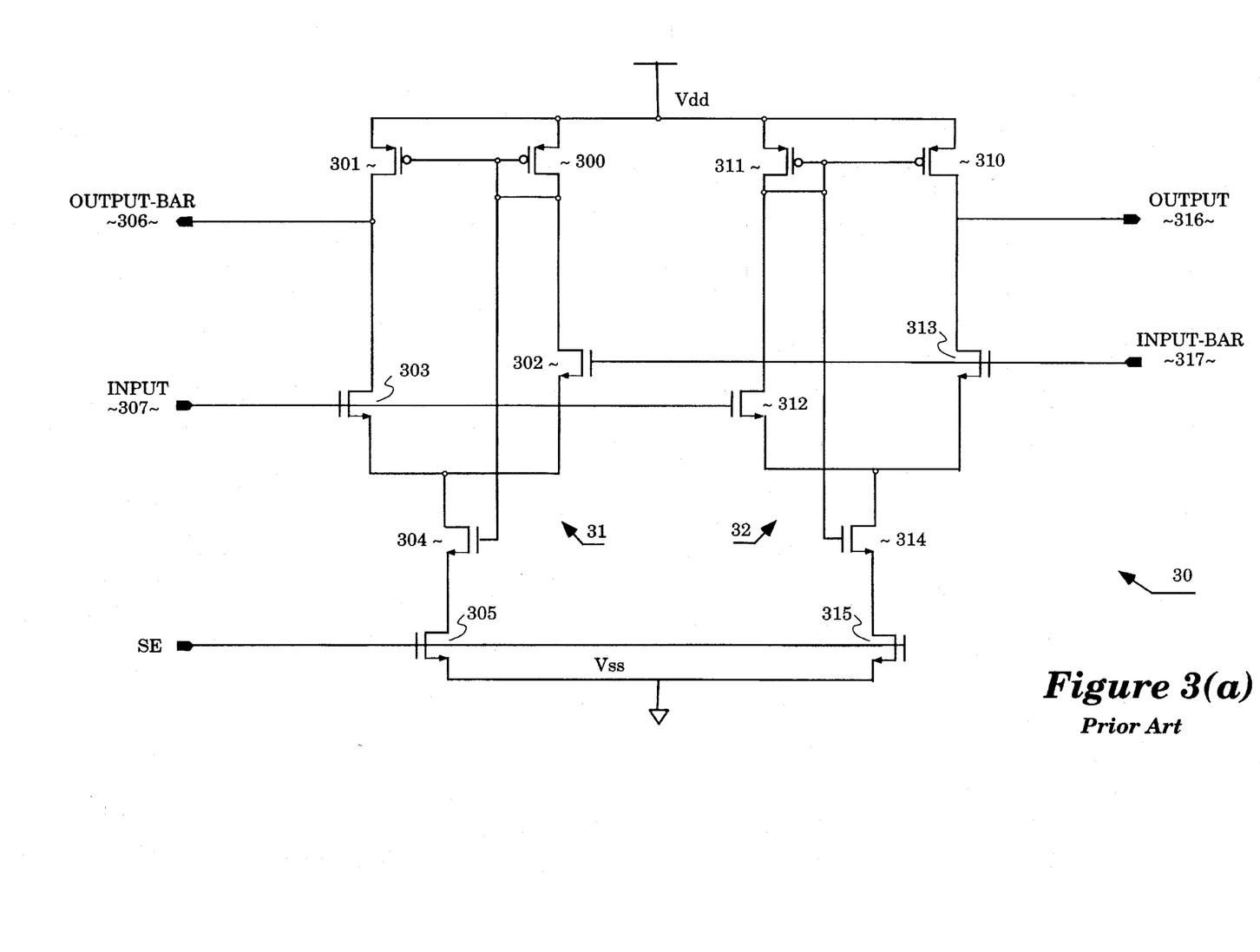
Figure 3B:
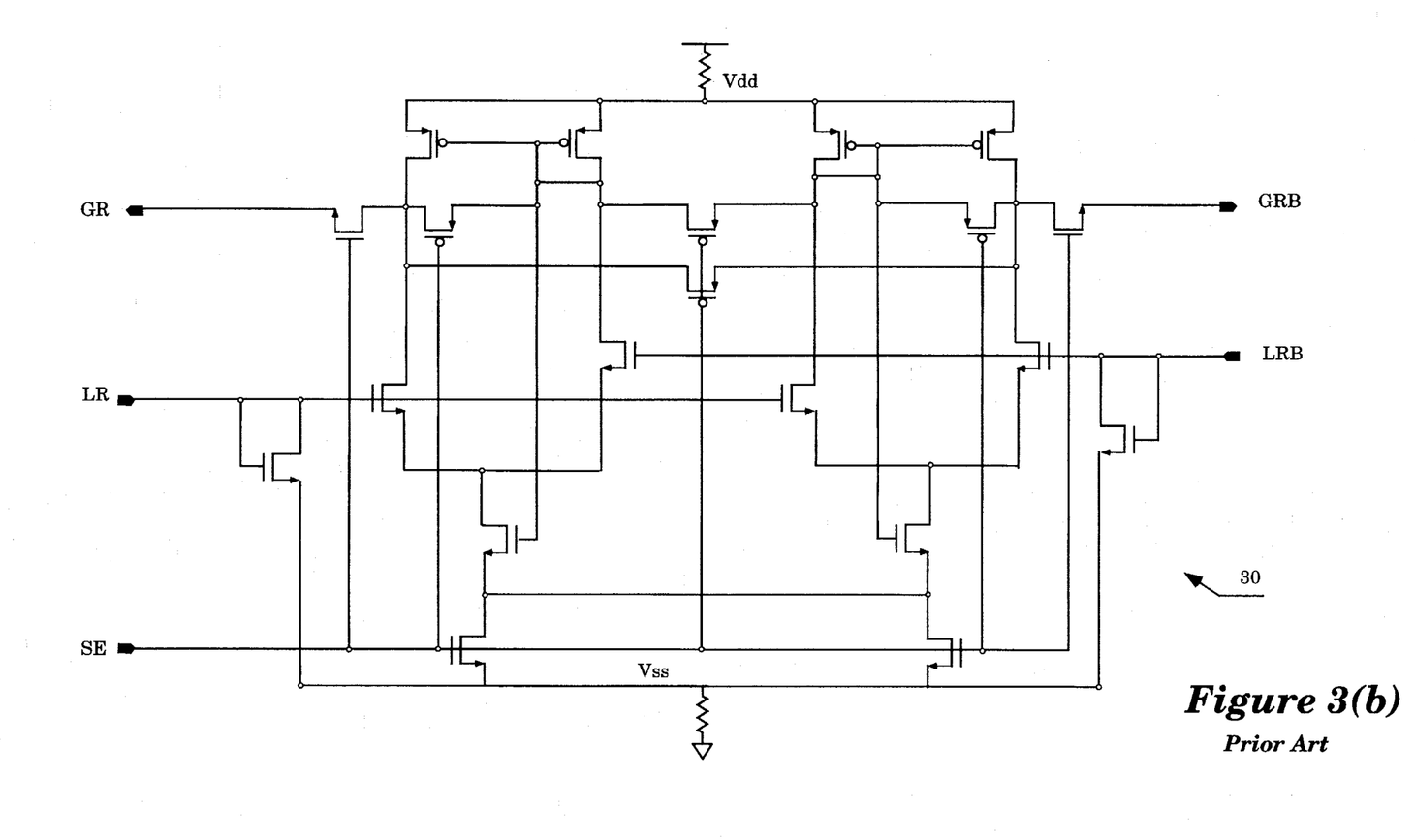

FIG. 3 is a schematic diagram of prior art sense amplifier 20 in greater detail. As shown in FIG. 3, a typical sense amplifier 30 comprises two differential amplifiers 31, 32. Input 307 and input-bar 317 are applied to common-emitter pair of transistors 303, 302, respectively in differential amplifier 31. Similarly, input 307 and input-bar 317 apply to the common-emitter pair of transistors 312, 313, respectively in differential amplifier 32. Tail device 304 in differential amplifier 31 is driven by the node connecting the gates of p-channel gate-coupled devices 300, 301. Also, tail device 314 is driven by the node connecting the gates of p-channel gate-coupled devices 310, 311 in differential amplifier 32.

Figure 4:
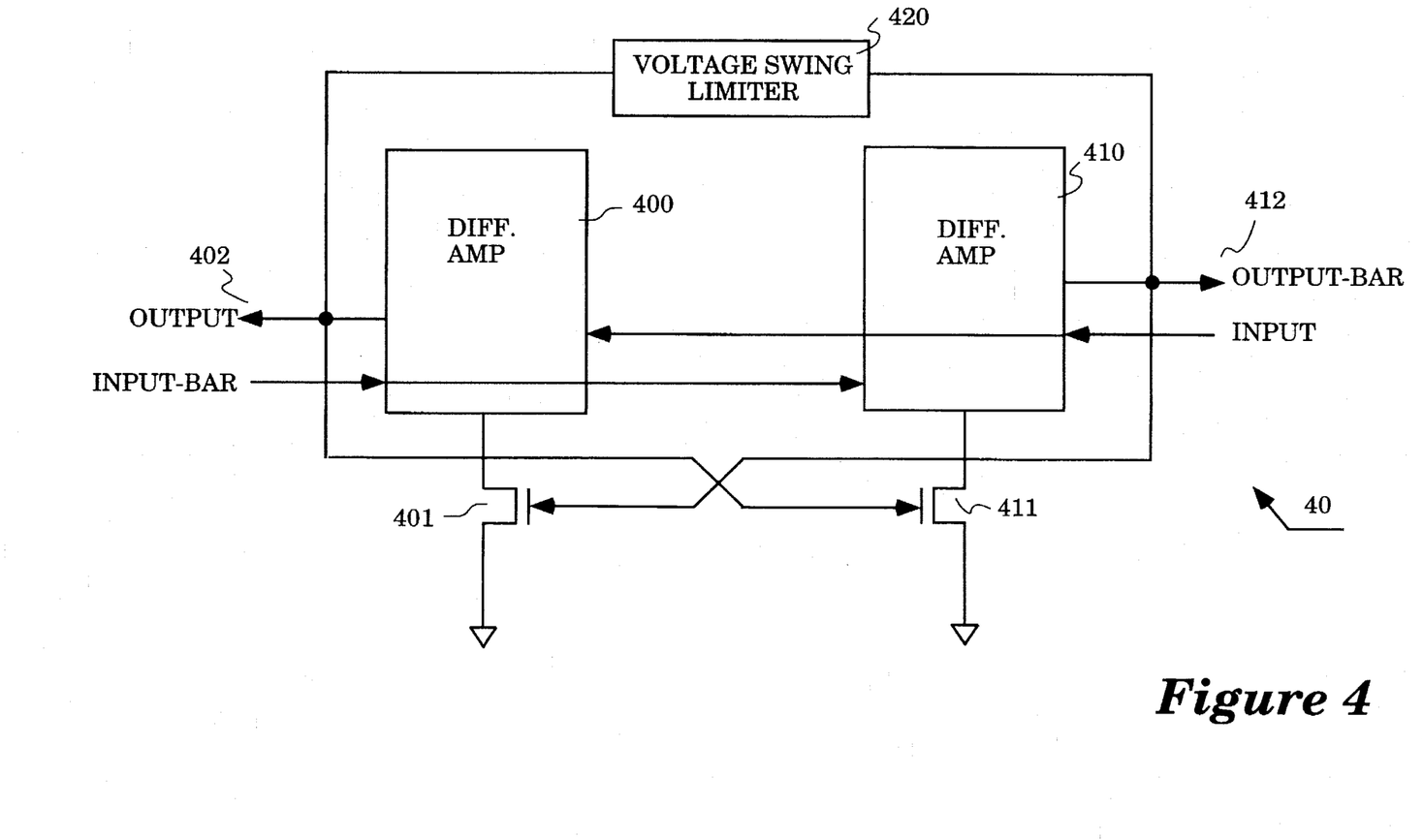
FIG. 4 illustrates a symbolic representation of sense amplifier in accordance with the teaching of the present invention is illustrated.

Reference is now made to FIG. 4, where a symbolic representation of sense amplifier 40 in accordance with the teaching of the present invention is illustrated. As shown in FIG. 4, output 402 of differential amplifier 400 and output-bar 412 of differential amplifier 410 are coupled to voltage swing limiter 420 to limit output voltage swing (currently to approximately 1 volt to 1.5 volts). It should be noted that although two differential amplifiers 400, 410 are shown as part of sense amplifier 40, those skilled in the art will appreciate that any dual-input, dual-output sense amplifier, instead of differential amplifiers 400, 410, can be used in sense amplifier 40 in accordance with the teaching of the present invention. Also, output-bar 412 is cross-coupled to drive tail device 401 of sense amplifier 400, while output 402 is fed back to drive tail device 411 of differential amplifier 410 such that the gain of differential amplifiers is improved. As will be appreciated by those skilled in the art, a reduced voltage swing on the output of the sense amplifier will reduce the recovery time between accesses, thus eliminating the need for the cumbersome ATD pulse. Also, tail devices 401, 411 with positive cross-coupled output feedback can increase the gain of sense amplifier 40, which is normally impossible without the voltage swing limiter, because a large swing on the output nodes will cause the circuit to latch.

With respect to voltage swing limiter 420, the output swing can be reduced such that when switching the data value of the inputs, the outputs have a shorter voltage swing to recover. This reduction of output swing can be implemented through a resistor, a transistor or a diode construction as can be easily determined by those skilled in the art in view of their specific implementations.

Further, if reduction in output voltage swing is sufficient, output voltages 402, 412 can also be positively fed back into sense amplifier circuit 40. As shown in FIG. 4, output 402, 412 can be used as a reference for the opposite tail device 411, 401, since output 402 is always opposite to output-bar 412. The positive feedback further enhances the rate of change of sense amplifier 40 and thus increases the throughput speed.

Figure 5A:
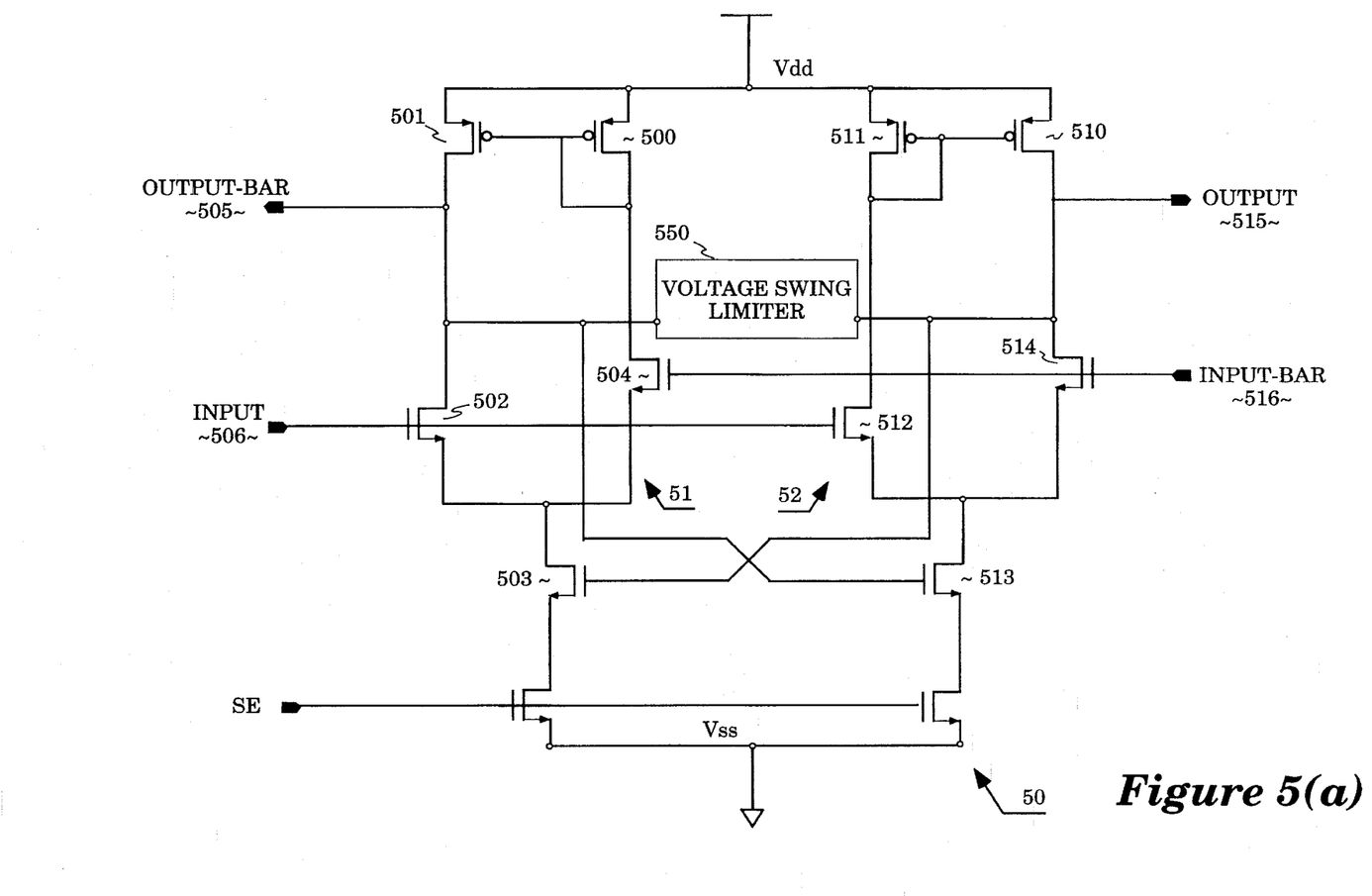
FIG. 5(a) illustrates a schematic diagram for one embodiment of sense amplifier in accordance with the teaching of the present invention is illustrated.

Reference is now made to FIG. 5(a), where a schematic diagram for one embodiment of sense amplifier 50 in accordance with the teaching of the present invention is illustrated. As shown in FIG. 5(a), sense amplifier 50 comprises differential amplifiers 51, 52, voltage swing limiter circuit 550 and output feedback's driving tail devices 503, 513. Differential amplifier 51 comprises gate-coupled p-channel transistors 500, 501 and emitter-coupled n-channel transistors 502, 503 and 504. The drains of p-channel transistors 500, 501 are coupled to Vdd, while their gates and the source of p-channel transistor 500 are coupled to the drain of n-channel transistor 504. The source of p-channel transistor 501 is connected to the drain of n-channel transistor 502 to form node output-bar 505. N-channel devices 502, 504 receive input 506 and input-bar 516 at their gates, respectively. Voltage-swing limiter 550 is coupled to output 515 and output-bar 505 so as to limit the output voltage swing between output-bar 505 and output 515. It should be apparent to those skilled in the art that the construction of differential amplifier 52 is a mirror image of differential amplifier 51.

Reducing the output voltage swing allows output 515 and output-bar 505 to provide a positive feedback to drive tail devices 503 and 513 respectively.

Figure 5B:
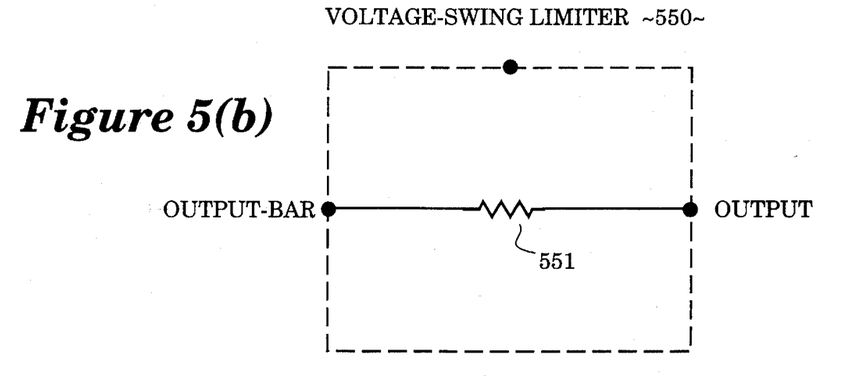
FIG. 5(b) illustrates one embodiment of voltage-swing limiter circuit.
Figure 5C:
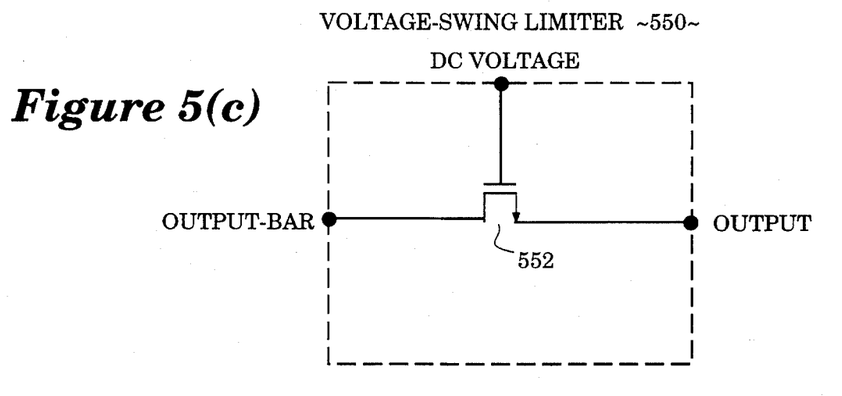
FIG. 5(c) illustrates another embodiment of voltage-swing limiter circuit implemented in a transistor.
Figure 5D:
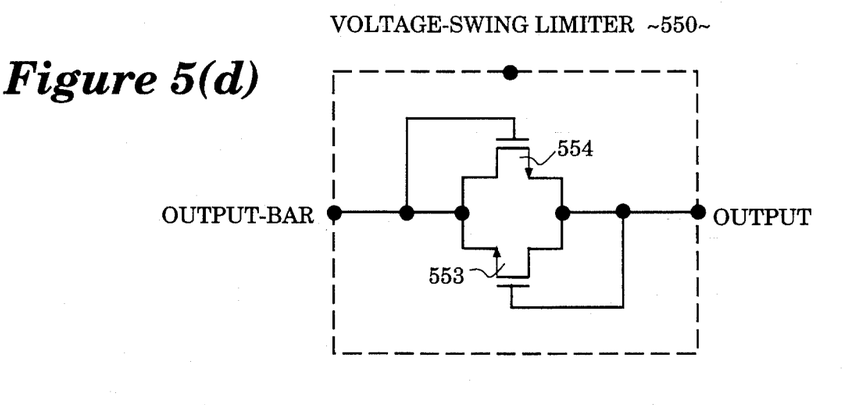
FIG. 5(d) illustrates voltage-swing limiter implemented in two diode-connected n-channel devices.
Figure 6:
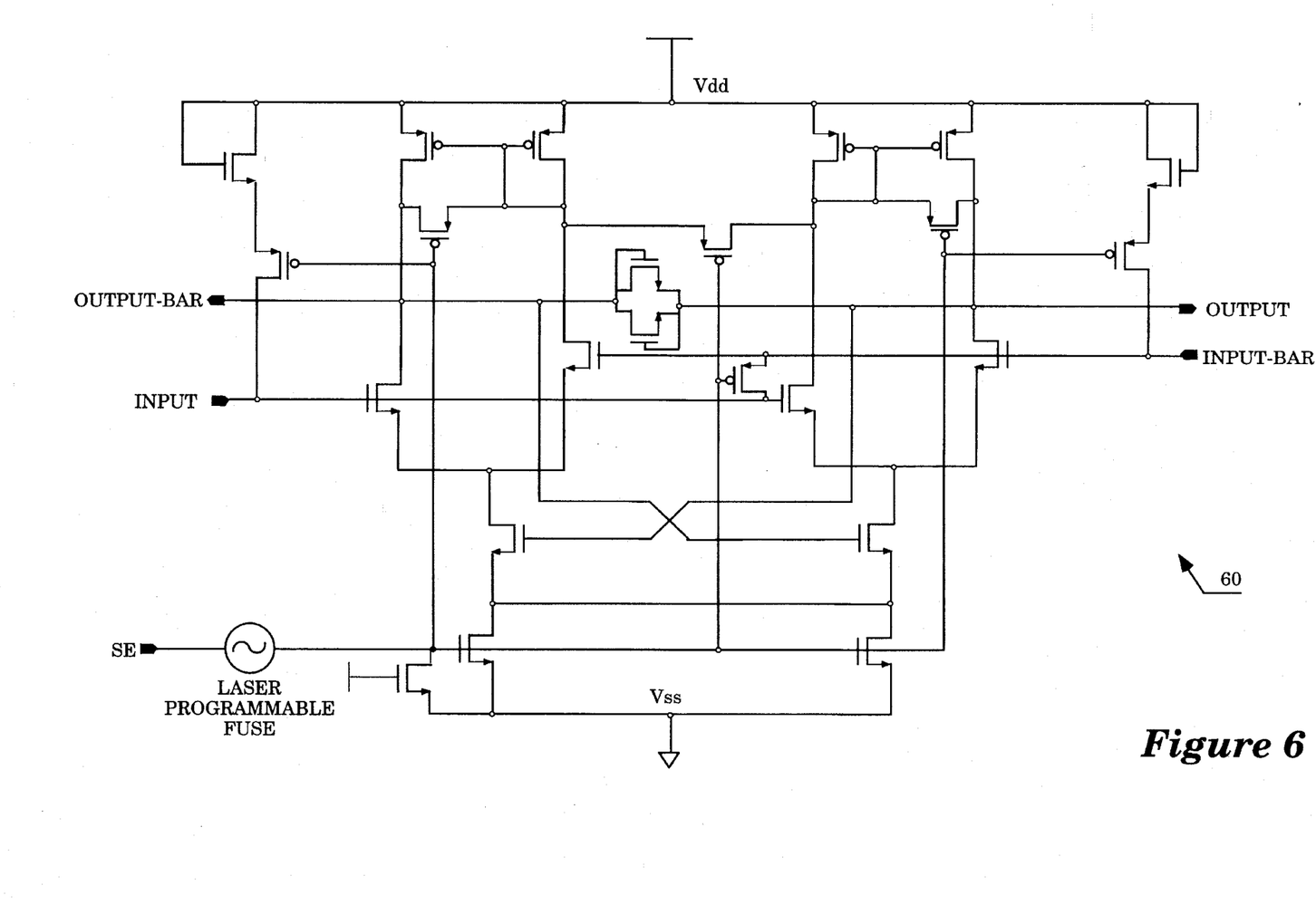
FIG. 6 is a schematic diagram of currently implemented sense amplifier in accordance with the teaching of the present invention.

Reference is now made to FIG. 5(b), where one embodiment of voltage-swing limiter 550 is illustrated. In this embodiment, voltage-swing limiter 550 is simply a resistor 551 coupled between output-bar and output. The value of the resistor can be easily determined by those skilled in the art to achieve the intended functionality. FIG. 5(c) illustrates a voltage-swing limiter 550 implemented in n-channel device 552 having its source/drain current path coupled between nodes output-bar and output. The gate of n-channel device 552 is coupled to a DC voltage. FIG. 5(d) illustrates voltage-swing limiter 550 implemented in two diode-connected n-channel devices 553, 554. FIG. 6 is a schematic diagram of currently implemented sense amplifier 60 in accordance with the teaching of the present invention. As will be apparent to those Skilled in the art, additional transistors have been included to provide drive and biasing functions to suit the particular purpose of this circuit.

Figure 7:
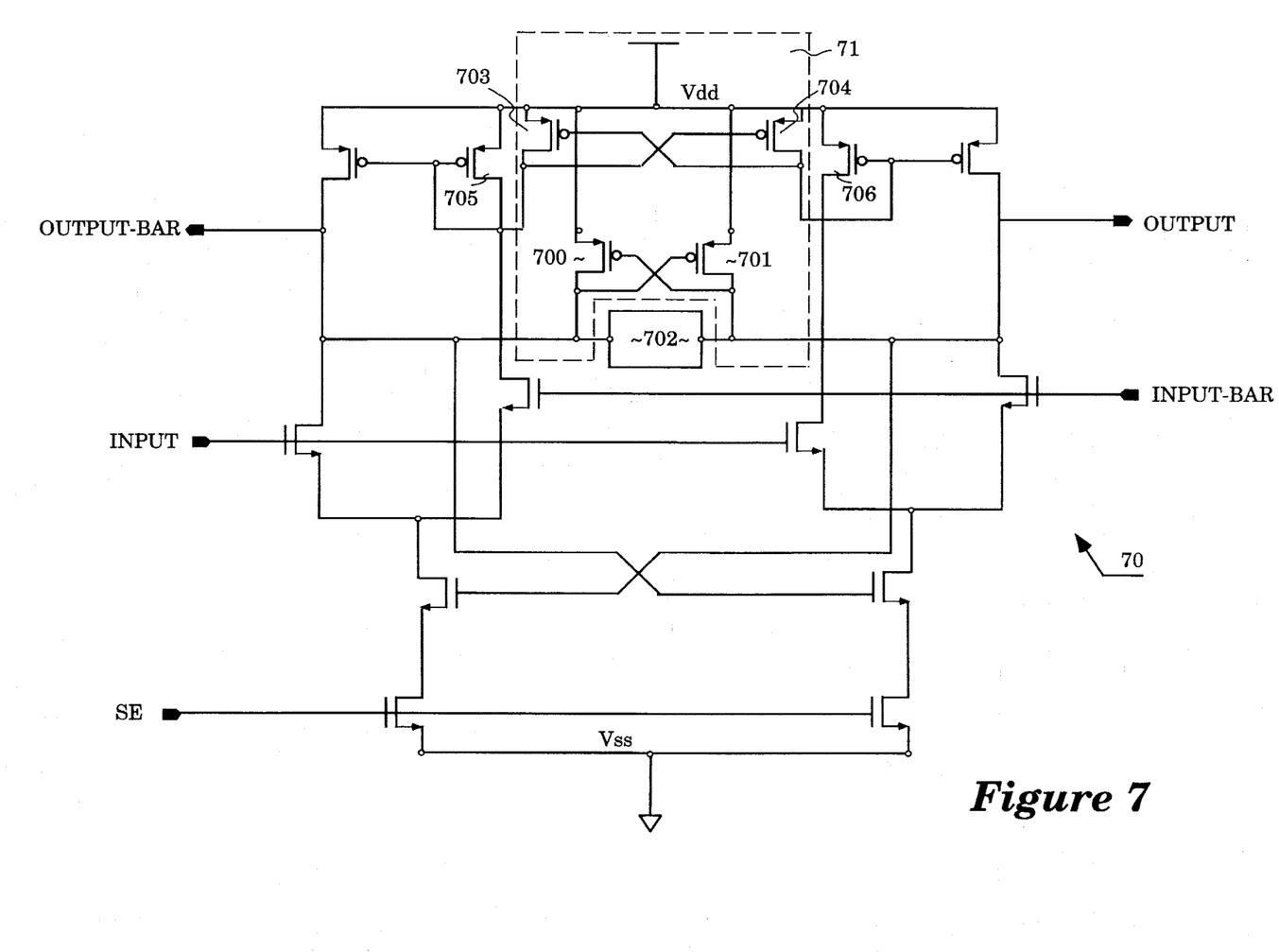
FIG. 7 is a schematic diagram of sense amplifier in another embodiment.

Reference is now made to FIG. 7, where a schematic diagram of sense amplifier 70 in another embodiment is illustrated. As shown in FIG. 7, within box 71, cross-coupled p-channel devices 700, 701 and 703, 704 are implemented to increase switching speed of amplifier 70. The drains of p-channel devices 703 and 704 are connected to Vdd while the sources of p-channel devices 703 and 704 are connected to the sources of p-channel devices 705 and 706, respectively. The source of p-channel device 703 is also cross-coupled to the gate of p-channel device 704, while the source of p-channel device 704 is cross-coupled to the gate of p-channel device 703. P-channel devices 700, 701 are also cross-coupled at their gates with respect to output and output-bar.

I claim:

1. A sense amplifier circuit comprising:
   a sense amplifier having a first output and a second output for providing a pair of complementary output signals from a pair of complementary input signals; and
   a voltage swing limiter coupled to said sense amplifier to receive said pair of complementary output signals, said voltage swing limiter limiting a voltage swing of said pair of complementary output signals; and
   wherein said voltage swing limiter comprises a resistor having a first terminal and a second terminal, Said first terminal being coupled to said first output and said second terminal being coupled to said second output.

* * * * *